United States Patent [19]
Reynolds

[11] 4,412,140
[45] Oct. 25, 1983

[54] CIRCUIT FOR REDUCING CURRENT TO LIGHT EMITTING DIODE OF OPTICALLY COUPLED DRIVER

[75] Inventor: David A. Reynolds, Scottsdale, Ariz.

[73] Assignee: Motorola, Inc., Schaumburg, Ill.

[21] Appl. No.: 322,810

[22] Filed: Nov. 19, 1981

[51] Int. Cl.³ .......................... H03K 3/42; H03K 3/01
[52] U.S. Cl. ..................... 307/311; 307/254; 307/299 B; 307/297
[58] Field of Search .................. 307/311, 299 B, 297, 307/254, 551

[56] References Cited

U.S. PATENT DOCUMENTS 3,826,930 7/1974 Perry ............................. 307/311
3,842,259 10/1974 Bruning ........................... 307/311
4,323,794 4/1982 Hoehn ............................. 307/299 B
4,344,003 8/1982 Harmon et al. .................... 307/296 A Primary Examiner—Stanley D. Miller
Assistant Examiner—B. P. Davis
Attorney, Agent, or Firm—William E. Koch

[57] ABSTRACT

A circuit is disclosed for reducing the average light emitting diode (LED) current required to latch an output triac. A ring oscillator coupled to a logic means provides a current pulse to the LED that triggers the optically coupled output triac early during each half sinewave. A biasing means for determining the current pulse duration is coupled between the ring oscillator and a.c. and d.c. input terminals.

10 Claims, 5 Drawing Figures

CIRCUIT FOR REDUCING CURRENT TO LIGHT EMITTING DIODE OF OPTICALLY COUPLED DRIVER

BACKGROUND OF THE INVENTION

1. Field of the Invention

This invention relates to optically coupled drivers and more specifically, to a circuit that reduces the average light emitting diode current required to latch the output device.

2. Prior Art

Requirements exist wherein data is transmitted between two circuits that must be electrically isolated from each other. For example, a microprocessor that switches on a high voltage motor may require isolation to prevent noise from the motor from interfering with the circuitry of the microprocessor, and any high voltage device switched on or off by an operator may require isolation of the manually operated switch as a safety precaution. In the past, such isolation was accomplished with devices such as relays and isolation transformers. Recently, however, the isolation has been accomplished, more cheaply and efficiently, with an optical coupler using semiconductor technology. A typical optical coupler has a light emitting diode and a triac mounted in a single package, but physically separated. An input signal drives the light emitting diode causing it to emit light which passes through a medium to the triac. The light striking the triac turns it on, providing a signal that is used to supply a current to the load. Typical medium resistance between the input light emitting diode and the output triac may be $10^{11}$ ohms.

One optical coupled triac driver presently being manufactured is enclosed in an integrated circuit package having six terminals. The light emitting diode is coupled to two input terminals for receiving a DC voltage input signal. These present devices require that the light emitting diode be driven with DC current at a relatively high current, e.g. 15 milliamperes, to latch the output triac. This high current is a problem in some applications.

Thus, the need exists for an inexpensive circuit for driving a light emitting diode of an optically coupled driver that operates at a lower average current.

SUMMARY OF THE INVENTION

Accordingly, it is an object of this invention to provide an improved optically coupled driver.

A further object of this invention is to provide a circuit that drives an optically coupled driver with current pulses.

Still another object of this invention is to provide an improved circuit which uses reduced current to maintain an optically coupled circuit in an energized state.

Yet another object of this invention is to provide a circuit that reduces the average current required to drive an optically coupled driver.

According to a first aspect of the invention there is provided a circuit having an oscillating means adapted to be coupled to a DC voltage for providing a current pulse. A logic means is coupled to the oscillating means for generating an output to an output means that provides for the current pulse.

The above and other objects, features and advantages of the present invention will be better understood from the following detailed description taken in conjunction with the accompanying drawings.

DESCRIPTION OF THE PREFERRED EMBODIMENTS

Figure 1:
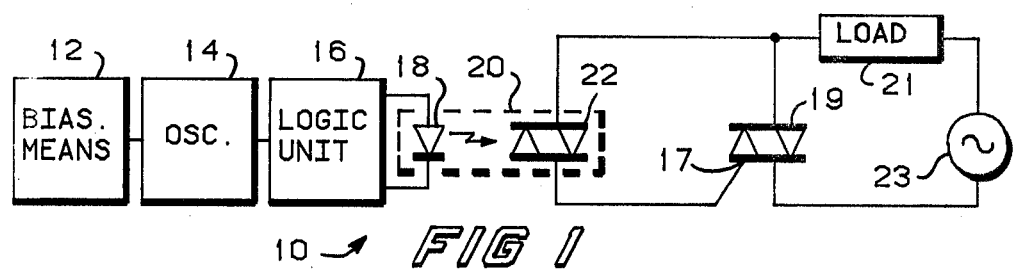
FIG. 1 illustrates a light emitting diode and circuit in block diagram form.

Referring to the block diagram of FIG. 1, the circuit 10 of the present invention includes a biasing network 12, an oscillator 14, and a logic unit 16. A light emitting diode (LED) 18 is coupled to the logic unit 16 and enclosed in a light propagating medium 20. An optically gated triac 22 is also enclosed in the medium 20, but is physically separated from the LED 18. The LED 18 and the optically gated triac 22, also called a photothyristor, are well-known by those in the art. These devices are manufactured in numerous models using various types of materials. The invention described herein is not to be limited to a specific type of construction or material for these devices. The preferred embodiment of the invention is in an integrated circuit format. The medium 20 may comprise any substance in which light may propagate. Examples include air, plastic, glass, or fiber optics.

The optically gated triac 22 is coupled to gate 17 of power triac 19 to control the amount of power delivered to load 21 from the a.c. power source 23. Load 21 is coupled between power triac 19 and a.c. power source 23. Load 21 may be any device normally used with the a.c. power source 23. Power can be delivered to load 21 only while power triac 19 is in the on state. Optically gated triac 22 triggers power triac 19 into the on state, and, thus, controls power delivered to load 21. Once triggered, power triac 19 will remain in the on state until the a.c. current flowing through load 21 and power triac 19 drops below the required holding current as the a.c. voltage approaches zero during each half sinewave.

The triac 22 requires a short triggering pulse of only a few microseconds during each half of a sinewave to latch on. However, to maximize power delivered to the load, triac 22 should latch on early during the half cycle, for example, in the first five degrees. One option is to pulse LED 18 every five degrees of the sinewave. A 10 microsecond pulse, for example, is sufficiently long enough to latch triac 22 and by having a pulse every five degrees instead of a continuous current, the average current is reduced substantially. The circuit described herein accomplishes this current reduction.

Figure 2:
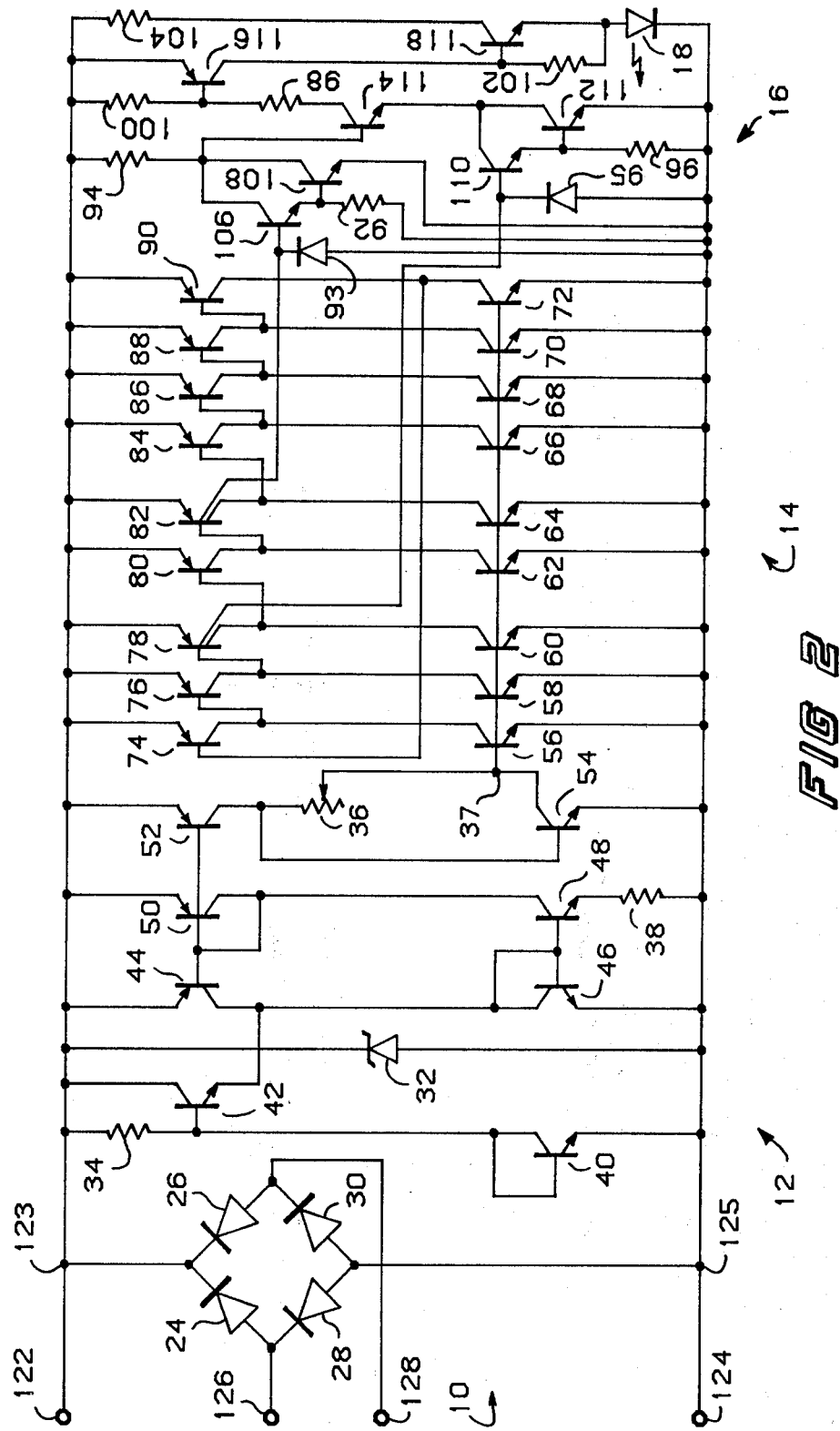
FIG. 2 is a detailed schematic of the optically coupled triac driver circuit.

Referring to FIG. 2, a detailed schematic of the circuit 10 is shown. The biasing network 12 includes diodes 24, 26, 28, 30, 32, resistors 34, 36, 38, and transistors 40, 42, 44, 46, 48, 50, 52 and 54. The oscillator 14 includes transistors 56, 58, 60, 62, 64, 66, 68, 70, 72, 74, 76, 78, 80, 82, 84, 86, 88, 90. The logic unit 16 includes resistors 92, 94, 96, 98, 100, 102, 104, transistors 106, 108, 110, 112, 114, 116, 118 and diodes 93, 95.

A first DC input terminal 122 and a second DC input terminal 124 are connected to nodes 123 and 125 respectively. Diodes 24, 26, 28 and 30 are coupled between nodes 123 and 124 to form a well-known bridge rectifying circuit for converting alternating current to direct current. The cathodes of diodes 24 and 26 are connected to node 123 and the anodes of diodes 28 and 30 are connected to node 125. A first AC input terminal 126 is connected to the anode of diode 24 and the cathode of diode 28. A second AC input terminal 128 is connected to the anode of diode 26 and the cathode of diode 30. AC input terminals 126 and 128 may be used when a DC supply is not connected to DC input terminals 122 and 124. Zener diode 32 is coupled between nodes 123 and 125, providing a voltage clamping means.

One terminal of resistor 34 is connected to node 123 with the other terminal connected to the collector and base of transistor 40 and to the base of transistor 42. The collector of transistor 42 is connected to node 123 and its emitter is connected to the collector of transistor 44, the collector and base of transistor 46 and the base of transistor 48. The base of transistor 44 is connected to the bases of transistors 50 and 52 and the collectors of transistors 48 and 50. The emitters of transistors 44, 50, and 52 are connected to node 123. The collector of transistor 52 is connected to the base of transistor 54 and coupled to node 37 by variable resistor 36. The collector of transistor 54 is connected to node 37. The emitters of transistors 40, 46, and 54 are connected to node 125. The emitter of transistor 48 is coupled to node 125 by resistor 38. The purpose of current source 12, just described, is to provide a low current at node 37 for driving oscillator 14.

The DC voltage across nodes 123 and 125 is supplied by an external DC voltage source at first and second DC input terminals 122 and 124 or by an external AC voltage source at first and second AC input terminals 126 and 128. Transistors 40 and 42 provide a starting current for the remaining portion of the current source 12. When a DC voltage first appears at nodes 123 and 125, a current flows through resistor 34 and transistor 40, turning on transistor 42, which provides current to the base of transistors 46 and 48. As transistors 46 and 48 turn on, current is drawn from transistors 44 and 50, also turning them on. The voltage at the emitter of transistor 42 is now high enough to shut off transistor 42. Transistors 44, 46, 48, 50, 52 and resistor 38 comprise a current source. By properly scaling the emitter junction area of transistor 44, a voltage is developed across resistor 38 which predetermines the amount of current in the emitter of transistor 50. This emitter current is mirrored in the emitter of transistor 52. Resistor 36 and the emitter area of transistor 54 are adjusted to set the voltage at node 37, and thus, the current flowing through current load transistors 56, 58, 60, 62, 64, 66, 68, 70 and 72. The current flowing through current load transistors 56, 58, 60, 62, 64, 66, 68, 70 and 72 determines the frequency of oscillator 14.

The oscillator 14 is best described as a ring oscillator comprising NPN current source load transistors 56, 58, 60, 62, 64, 66, 68, 70, 72 and PNP switching transistors 74, 76, 78, 80, 82, 84, 86, 88, 90. The emitters of transistors 56, 58, 60, 62, 64, 66, 68, 70 and 72 are connected to node 125 and the emitters of transistors 74, 76, 78, 80, 82, 84, 86, 88 and 90 are connected to node 123. Each of the collectors of transistors 56, 58, 60, 62, 64, 66, 68, 70 and 72 are connected to one of the collectors of transistors 74, 76, 78, 80, 82, 84, 86, 88 and 90, i.e., the collector of transistor 56 to the collector of transistor 74, the collector of transistor 58 to the collector of transistor 76, etc. The bases of transistors 74, 76, 78, 80, 82, 84, 86, 88 and 90 are coupled to the collector of the preceding PNP transistor, i.e., the base of transistor 90 to the collector of transistor 88, the base of transistor 74 to the collector of transistor 90, etc. The bases of transistors 56 through 72 are connected to node 37.

Figure 3:
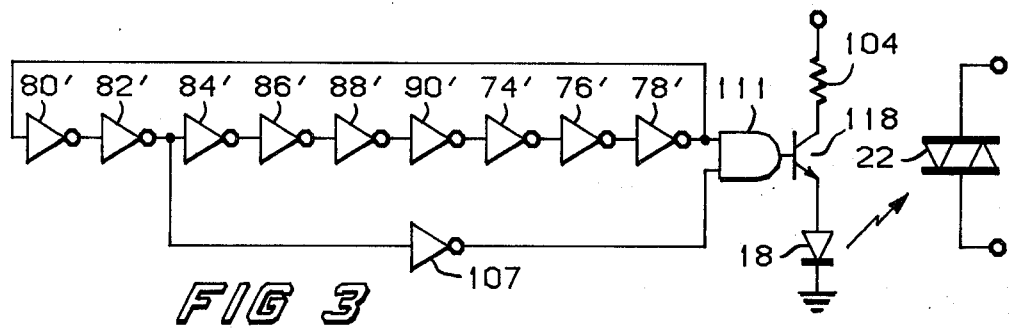
FIG. 3 illustrates in partial block diagram form the logic of the optically coupled triac driver circuit.

The operation of oscillator 14 may best be understood by referring to the logic diagram of FIG. 3 along with the schematic in FIG. 2. Oscillator 14 comprises the serial connection of an odd number of inverters 74', 76', 78', 80', 82', 84', 86', 88' and 90' with the output of inverter 78' connected to the input of inverter 80'. Each inverter 74', 76', 78', 80', 82', 84', 86', 88' and 90' comprises one of the lateral PNP transistors 74, 76, 78, 80, 82, 84, 86, 88 and 90 and one of the current source load transistors 56, 58, 60, 62, 64, 66, 68, 70 and 72. For example, inverter 74' is comprised of PNP transistor 74 and current source load transistor 56. This configuration does not have a stable state, with the frequency of oscillation being set by the delay times of lateral PNP transistors 74, 76, 78, 80, 82, 84, 86, 88 and 90 and the number of inverters 74', 76', 78', 80', 82', 84', 86', 88', and 90'. The delay time is a function of the collector current in PNP transistors 74, 76, 78, 80, 82, 84, 86, 88 and 90 and is adjustable by varying the current in current source load transistors 56, 58, 60, 62, 64, 66, 68, 70 and 72. The duty cycle of the current pulses provided to LED 18 is determined by the number of inverters 74', 76', 78', 80', 82', 84', 86', 88' and 90' in the oscillator 14. For nine inverters as shown, LED 18 is on approximately 11 percent of the time.

Transistors 78 and 82 have dual collectors, which are coupled to the logic unit 16. Actually, any two of the transistors 74, 76, 78, 80, 82, 84, 86, 88 and 90 may be selected as having dual collectors; however, the preferred embodiment would have them spaced two transistors apart from each other. The on-off pulse of each transistor exhibits a sharp rising transition but a slow downward or fall-off transition. By having the dual collector transistors separated by one transistor, the LED 18 current pulse would have similar sharp upward transitions.

The second collector of transistor 78 is connected to the base of transistor 110 and the second collector of transistor 82 is connected to the base of transistor 106. Transistors 106 and 108 are connected in the well known Darlington configuration and function as an inverter in the logic unit 16. The emitter of transistor 106 is connected to the base of transistor 108 and coupled to node 125 by resistor 92. The collectors of transistor 106 and 108 are connected to the base of transistor 114 and coupled to node 123 by resistor 94. Transistors 110 and 112 are also connected in the Darlington configuration with the emitter of transistor 110 connected to the base of transistor 112 and coupled to node 125 by resistor 96. Since circuit 10 is designed to be used within optical cavity 20, the circuit will be illuminated by LED 18. Transistors 106, 108, 110 and 112 are optically sensitive and their function would be impaired by the addition of photogenerated current in the bases of transistors 106 and 110. Photodiodes 93 and 95 are coupled between the bases of transistors 106 and 110 respectively, and node 125 to provide a current path to ground during those periods when LED 18 is on, thereby, removing any photogenerated current. The emitter of transistors 108 and 112 are connected to node 125. The collectors of transistors 110 and 112 are connected to the emitter of transistor 114. The base of transistor 116 is coupled to the collector of transistor 114 by resistor 98 and coupled to node 123 by resistor 100. The emitter of transistor 116 is connected to node 123. The collector of transistor 116 is connected to the base of transistor 118 and coupled to the emitter of transistor 118 and the anode of LED 18 by resistor 102. The cathode of LED 18 is connected to node 125. The collector of transistor 118 is coupled to node 123 by resistor 104.

The operation of logic unit 16 may be best understood by initially assuming transistors 78 and 82 are off and no collector current is flowing therefrom. When current from the second collector of transistor 78 turns on transistors 110 and 112, transistor 114 is also on since the voltage at its base is high. When current from the second collector of transistor 82 turns on transistors 106 and 108, the voltage at the base of transistor 114 goes low, turning off transistor 114. Therefore, current flows through transistor 114 only when current is received from the second collector of transistor 78 and not from the second collector of transistor 82. When transistor 114 is on, transistors 116 and 118 are also on providing a driving pulse current to LED 18.

The operation of oscillator 14 and logic unit 16 may be more easily understood by referring to the logic diagram of FIG. 3. The inverters of FIG. 3 identified with a prime number represent the equivalent numbered transistor of the oscillator 14. Inverter 107 includes transistors 106 and 108. AND gate 111 includes transistors 110, 112, 114 and 116. AND gate 111 receives an input from both inverters 78' and 107. When these two signals are high, transistor 118 is enabled and LED 18 receives a driving current. Since inverter 107 inverts the signal from inverter 82' it is seen that LED 18 is driven when the signal from 78' is high and the signal from 82' is low.

Figure 4:
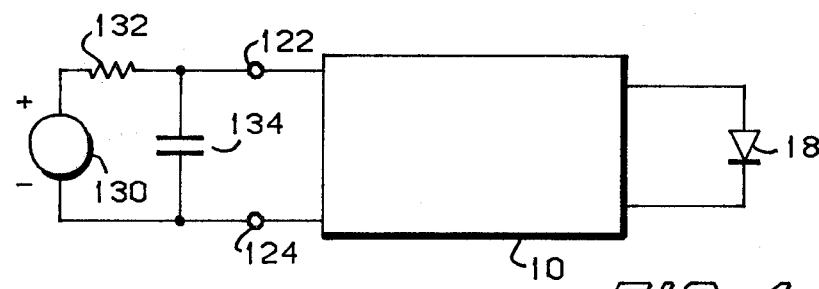
FIG. 4 illustrates the circuit as powered by a d.c. power supply.

Referring to FIG. 4, circuit 10 is shown powered by a d.c. voltage source 130. Resistor 132 is coupled between d.c. voltage source 130 and node 122 to set the magnitude of the current pulses through LED 18. Capacitor 134 is coupled between nodes 122 and 124 to reduce the ripple on the voltage source 130.

Figure 5:
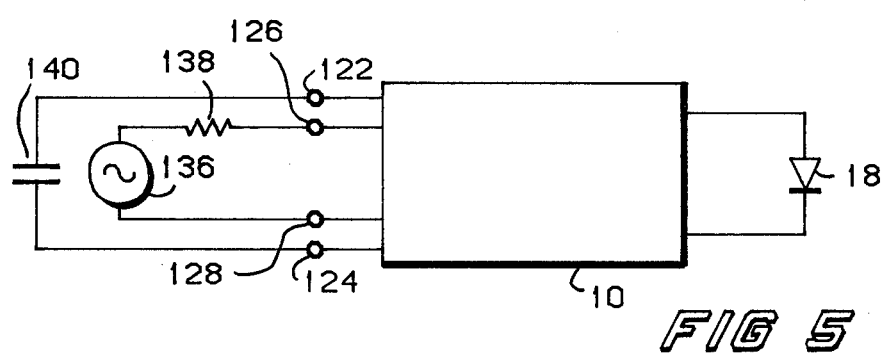
FIG. 5 illustrates the circuit as powered by an a.c. power supply.

Referring to FIG. 5, circuit 10 is shown powered by an a.c. voltage source 136. Resistor 138 is coupled between a.c. voltage source 136 and node 126 to set the magnitude of the current pulses through LED 18. Capacitor 140 is coupled across nodes 122 and 124 to supply power to circuit 10 during the time that the a.c. voltage source 136 is near the zero voltage point of the a.c. voltage sinewave.

Consequently, while in accordance with the Patent Statutes, there has been described what at present is considered to be the preferred forms of the invention. It will be obvious to those skilled in the art that numerous changes and modifications may be made herein without departing from the spirit and scope of the invention, and it is therefore aimed that the following claims cover all such modifications.

I claim:

1. A circuit for providing periodic light pulses to an optically coupled light responsive device, said optically coupled light responsive device enabling a substantially continuous current path to a load, said circuit comprising:

oscillating means adapted to be coupled to a voltage source for generating a first repetitive signal and a second repetitive signal;

logic means coupled to said oscillating means and responsive to said first and second repetitive signals for generating an output, said logic means including a means for removing photogenerated current therein;

output means coupled to said logic means and responsive to said output for generating a current pulse; and light emitting means coupled to said output means and responsive to said current pulse for providing said periodic light pulse.

2. A circuit for providing periodic light pulses to an optically coupled light responsive device, said optically coupled light responsive device enabling a substantially continuous current path to a load, said circuit comprising:

oscillating means adapted to be coupled to a voltage source, including a plurality of load transistors and a plurality of inverting transistors, one of each of said load transistors and one of each of said inverting transistors having collectors coupled therebetween and coupled by their emitters between said voltage source, wherein two of said inverting transistors generate a first and a second repetitive signal;

logic means coupled to said oscillating means and responsive to said first and second repetitive signals for generating an output;

output means coupled to said logic means and responsive to said output for generating a current pulse; and light emitting means coupled to said output means and responsive to said current pulse for providing said periodic light pulse.

3. The circuit according to claim 2 wherein two of said inverting transistors have a second collector for providing said first and second repetitive signals.

4. The circuit according to claim 3 wherein said oscillating means includes a current source coupled to said voltage source for generating a low current to drive said load transistors.

5. The circuit according to claim 3 wherein said oscillating means includes a rectifying means adapted to be coupled to an AC voltage source for providing a rectified voltage to said circuit.

6. The circuit according to claim 3 wherein said logic means comprises:

a first logic control coupled to one of said second collectors;

a second logic control coupled to the other second collector; and a logic gate coupled to said first and second logic controls.

7. A circuit for reducing current supplied to a light emitting device, the circuit being fully integrated on a semiconductor chip and having first and second voltage terminals, the circuit comprising:

current source means coupled to said first and second voltage terminals for generating a current;

oscillating means coupled to said current source means, said oscillating means comprising:

a plurality of load transistors having a control electrode responsive to said generated current and a first and second current electrode;

a plurality of inverter transistors having a control electrode and a first and second current electrode, one of each of said load transistors and one of each of said inverter transistors having said first current electrodes coupled therebetween and coupled by said second current electrodes between said first and second voltage terminal, said control electrodes of said inverter transistors responsive to said first current electrode of another of said inverter transistors, two of said inverter transistors having a third current electrode for generating a first and second repetitive signal;

logic means coupled to said oscillating means comprising:
- a first logic control having at least one transistor having a control electrode responsive to said first repetitive signal;
- a second logic control having at least one transistor having a control electrode responsive to said second repetitive signal; and
- a logic gate coupled to said first and second logic controls for providing a logic signal;

output means responsive to said logic signal for generating a current pulse; and a light emitting device coupled to said output means and responsive to said current pulse for providing a pulse of light.

8. The circuit according to claim 7 further having third and fourth voltage terminals, said circuit including a rectifying means coupled to said third and fourth voltage terminals for providing a rectified voltage to said current source means.

9. The circuit according to claim 7 further comprising a first and second optically sensitive device coupled between said control electrode of said first and second logic controls, respectively, and said second voltage terminal, for substantially removing photogenerated current in said first and second logic control transistors.

10. The circuit according to claim 7 further comprising a light responsive device optically coupled to said light emitting device for enabling a current path to a load.

* * * * *